(12) United States Patent
Kim et al.

(10) Patent No.: US 9,275,561 B2
(45) Date of Patent: Mar. 1, 2016

(54) OPTICAL ADHESIVE FILM AND FLAT PANEL DISPLAY DEVICE HAVING THE SAME

(75) Inventors: Hwan-Jin Kim, Yongin (KR); Jeong-Ho Hwang, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 1046 days.

(21) Appl. No.: 13/242,598

(22) Filed: Sep. 23, 2011

(65) Prior Publication Data

US 2012/0113369 A1 May 10, 2012

(30) Foreign Application Priority Data

Nov. 9, 2010 (KR) .......................... 10-2010-0110996
Jun. 2, 2011 (KR) .......................... 10-2011-0053376

(51) Int. Cl.
*G02F 1/1333* (2006.01)
*G09F 3/10* (2006.01)
(Continued)

(52) U.S. Cl.
CPC ............ *G09F 3/10* (2013.01); *G02F 1/133308* (2013.01); *G09F 7/12* (2013.01); *H01L 51/524* (2013.01); *H01L 51/5246* (2013.01); *G02F 2001/133311* (2013.01);
(Continued)

(58) Field of Classification Search
CPC .............. G02F 1/133308; G02F 2001/133311; G02F 2202/28; H01L 51/524; H01L 51/5246; H01L 51/5271; H01L 51/5284; G09F 3/10; G09F 7/12; Y10T 428/24215

USPC ............................................... 349/58–60, 122
See application file for complete search history.

(56) References Cited

U.S. PATENT DOCUMENTS 4,425,030 A * 1/1984 Schmidt ........................ 349/122
2002/0050782 A1 5/2002 Ito et al.
(Continued)

FOREIGN PATENT DOCUMENTS

CN 1351320 A 5/2002
JP 07186331 A 7/1995
(Continued)

OTHER PUBLICATIONS

Chinese Office Action issued by Chinese Patent Office on Apr. 8, 2015 in connection with Chinese Patent Application No. 201110352005.7 which also claims Korean Patent Application No. 2011-0053376 and 2010-0110996 as its priority document. Request for Entry of the accompanying office action attached herewith.

(Continued)

*Primary Examiner* — Charles Chang
(74) *Attorney, Agent, or Firm* — Robert E. Bushnell, Esq.

(57) ABSTRACT

An optical adhesive film for improving the adhesive strength between constitutional elements of a flat panel display device, and a flat panel display device having the same. According to an aspect of the present invention, there is provided an optical adhesive film for use in a flat panel display module that displays an image, the optical adhesive film including a transmission unit disposed on the flat panel display module and allowing the image to transmit through the transmission unit; a wing member extending from at least one side surface of the transmission unit, and covering side surfaces and a portion of a rear surface of the flat panel display module; and an adhesive member disposed covering all surfaces of the transmission unit and the wing member.

14 Claims, 6 Drawing Sheets

(51) Int. Cl.
*G09F 7/12* (2006.01)
*H01L 51/52* (2006.01)

(52) U.S. Cl.
CPC ........ *G02F 2202/28* (2013.01); *H01L 51/5271* (2013.01); *H01L 51/5284* (2013.01); *Y10T 428/24215* (2015.01)

(56) References Cited

U.S. PATENT DOCUMENTS

| | | | |
|---|---|---|---|
| 2004/0009621 A1 | 1/2004 | Shih | |
| 2007/0170324 A1 | 7/2007 | Lee et al. | |
| 2009/0141209 A1* | 6/2009 | Chen et al. | 349/58 |
| 2009/0310057 A1 | 12/2009 | Kang et al. | |
| 2010/0315575 A1* | 12/2010 | Chang | G02F 1/133308 349/62 |

FOREIGN PATENT DOCUMENTS

| | | |
|---|---|---|
| JP | 09281474 A | 10/1997 |
| JP | 09292533 A | 11/1997 |
| JP | 2012003177 A | 1/2012 |
| KR | 20040009621 | 1/2004 |
| KR | 20080035784 | 4/2008 |
| KR | 20080086285 | 9/2008 |
| KR | 20090129559 | 12/2009 |

OTHER PUBLICATIONS

Japanese Office Action issued by Japanese Patent Office on Jun. 23, 2015 in corresponding Japanese Patent Application No. 2011-222077 and Request for Entry of the Accompanying Office Action attached herewith.

* cited by examiner

OPTICAL ADHESIVE FILM AND FLAT PANEL DISPLAY DEVICE HAVING THE SAME

CLAIM PRIORITY

This application claims the benefit of Korean Patent Application No. 10-2010-0110996, filed on Nov. 9, 2010 and Korean Patent Application No. 10-2011-0053376, filed on Jun. 2, 2011, in the Korean Intellectual Property Office, the disclosure of which is incorporated herein in its entirety by reference.

BACKGROUND OF THE INVENTION

1. Field of the Invention

One or more aspects of the present invention relate to an optical adhesive film and a flat panel display device having the same.

2. Description of the Related Art

Various display devices have recently been developed to replace cathode ray tubes. Examples of such display devices include a liquid crystal display (LCD), a field emission display (FED), a plasma display panel (PDP), and an electroluminescent (EL) display.

From among these display devices, the PDP has drawn much attention since it has a simple structure, and its manufacturing process is considered most suitable to provide a large screen. However, the PDP has low luminescence efficiency and brightness and consumes a large amount of power.

The EL display may be largely classified into an inorganic EL device and an organic EL device according to the material of the emission layer. The EL display is a self-emitting device, and has a quick response time, high luminescence efficiency, high brightness, and wide viewing angles. In particular, an organic light-emitting diode (OLED) display device, which is an EL device using an organic material, requires a low direct-current (DC) driving voltage, can be manufactured as a thin-film display device, can emit light having uniform characteristics, is easy to manufacture in terms of pattern formation, has high luminescence efficiency, and can emit various colors in the visible region. Therefore, research has been actively conducted into the field of OLED display devices.

In the case of such an organic EL device, a bottom-emission method or a top-emission method may be established according to the direction in which light is emitted. Also, an organic EL device may be classified into passive organic light-emitting diode (PMOLED) devices and active PMOLED (AMOLED) devices according to the driving method.

SUMMARY OF THE INVENTION

One or more aspects of the present invention provide an optical adhesive film for improving the adhesive strength between panels of a flat panel display device, and a flat panel display device having the same.

According to an aspect of the present invention, there is provided an optical adhesive film for use in a flat panel display module that displays an image, the optical adhesive film including a transmission unit disposed on the flat panel display module which allows an image to transmit through the transmission unit; and a wing member extending from at least one side surface of the transmission unit and substantially covering as least a side surface and at least a portion of a rear surface of the flat panel display module. The transmission unit is autohered to a front surface of the flat panel display module, and the wing member is autohered to side surfaces and the rear surface of the flat panel display module.

The transmission unit or the wing member may be directly attached to the flat panel display module without having any member therebetween.

The transmission unit or the wing member may be autohered to the flat panel display module due to surface energy therebetween.

The wing member may include a base portion extending from a side surface of the transmission unit, a light-shielding member disposed on the base portion, and a reflection member disposed on the light-shielding member.

According to an aspect of the present invention, there is provided an optical adhesive film for use in a flat panel display module that displays an image, the optical adhesive film including a transmission unit disposed on the flat panel display module and allowing the image to transmit through the transmission unit; a wing member extending from at least one side surface of the transmission unit, and covering at least one side surface and at least a portion of a rear surface of the flat panel display module; and an adhesive member disposed substantially covering all surfaces of the transmission unit and the wing member. The adhesive member is disposed between the flat panel display module, the transmission unit, and the wing member to bond the flat panel display module, the transmission unit, and the wing member with one another.

The transmission unit may allow light emitted from the flat panel display device to pass through the transmission unit.

The transmission unit may include a material such as polyethylene terephthalate (PET), a triacetyl cellulose (TAC) film, polyethylene (PE), acryl, or polyolefin.

The size of the transmission unit may be equal to or greater than the size of a display region of the flat panel display module, on which the image is displayed.

The width of the wing member may be greater than the height of the flat panel display module.

The wing member may cover at least a side surface and at least a portion of a rear surface of the flat panel display module.

The wing member may include a base portion extending from a side surface of the transmission unit; a light-shielding member disposed on the base portion; and a reflection member disposed on the light-shielding member.

The base portion may be combined with the transmission unit as one body.

The base portion may include a material such as polyethylene terephthalate (PET), a triacetyl cellulose (TAC) film, polyethylene (PE), acryl, or polyolefin.

The light-shielding member may absorb external light incident via the base portion.

The light-shielding member may include paint or pigment that absorbs visible light.

The size of the light-shielding member may be equal to or greater than the size of the reflection member.

The light-shielding member may be disposed substantially on the entire wing member and a portion of the transmission unit.

The reflection member may reflect light emitted from the flat panel display module, thereby preventing the light from leaking to the outside The reflection member may include paint or pigment that absorbs light.

The adhesive member may allow light to penetrate through.

According to another aspect of the present invention, there is provided a flat panel display device including a flat panel display module for displaying an image; and an optical adhesive film adhered onto, not only front and side surfaces of the flat panel display module, but also a portion of a rear surface of the flat panel display module. The image displayed on the front surface of the flat panel display module is output via the optical adhesive film.

The optical adhesive film may include a transmission unit disposed on the front surface of the flat panel display module and allowing the image to transmit through the transmission unit; a wing member extending from at least one side surface of the transmission unit, and covering the side surface and the portion of the rear surface of the flat panel display module; and an adhesive member substantially disposed over the transmission unit and the wing member. The adhesive member is disposed between the flat panel display module, the transmission unit, and the wing member so as to bond the flat panel display module, the transmission unit, and the wing member with one another.

The transmission unit may allow light emitted from the flat panel display module to transmit through the transmission unit.

The transmission unit may include a material such as polyethylene terephthalate (PET), a triacetyl cellulose (TAC) film, polyethylene (PE), acryl, or polyolefin.

The size of the transmission unit may be equal to or greater than the size of a display region of the flat panel display module, on which the image is displayed.

The width of the wing member may be greater than the height of the flat panel display module.

The wing member may cover the side surface and a portion of the rear surface of the flat panel display module.

The wing member may include a base portion extending from at least one side surface of the transmission unit; a light-shielding member disposed on the base portion; and a reflection member disposed on the light-shielding member.

The base portion may be combined with the transmission unit as one body.

The base portion may include a material such as polyethylene terephthalate (PET), a triacetyl cellulose (TAC) film, polyethylene (PE), acryl, or polyolefin.

The light-shielding member may absorb external light incident via the base portion.

The light-shielding member may include paint or pigment that absorbs visible light.

The size of the light-shielding member may be equal to or greater than the size of the reflection member.

The light-shielding member may be disposed on the entire wing member and a portion of the transmission unit.

The reflection member may reflect light emitted from the flat panel display module, thereby preventing the light from leaking to the outside.

The reflection member may include paint or pigment that absorbs light.

The flat panel display module may have a structure, in which a backlight unit, a polarizing plate, and a liquid crystal panel are sequentially stacked.

According to another aspect of the present invention, there is provided a flat panel display device including a flat panel display module for displaying an image; and an optical adhesive film autohered onto, not only on front and side surfaces of the flat panel display module, but also on a portion of a rear surface of the flat panel display module. The image displayed on the front surface of the flat panel display module is output via the optical adhesive film. The optical adhesive film is directly adhered onto the flat panel display module due to surface energy therebetween and without having any member between the optical adhesive film and the flat panel display module.

The optical adhesive film may include a transmission unit disposed on the front surface of the flat panel display module and allowing the image to transmit through the transmission unit, and a wing member extending from at least one side surface of the transmission unit and covering the side surfaces and a portion of a rear surface of the flat panel display module. The transmission unit may be attached to the front surface of the flat panel display module, and the wing member may be autohered to the side surfaces and the rear surface of the flat panel display module.

The wing member may include a base portion extending from a side surface of the transmission unit, a light-shielding member disposed on the base portion, and a reflection member disposed on the light-shielding member.

BRIEF DESCRIPTION OF THE DRAWINGS

The above and other features of the present invention will become more apparent by describing in detail exemplary embodiments thereof with reference to the attached drawings in which.

DETAILED DESCRIPTION

Hereinafter, exemplary embodiments of the present invention will be described in greater detail with reference to the accompanying drawings.

An active LCD that uses a thin film transistor (TFT) as a switch device is manufactured using a semiconductor manufacturing process, and it is thus difficult to provide a large screen, but has come into widespread use as a display device for notebook computers.

An LCD is a non self-emitting device, and may include a liquid crystal panel and a backlight unit. The backlight unit is disposed below the liquid crystal panel, and is bonded with the liquid crystal panel via double-faced adhesive tape.

Figure 1:
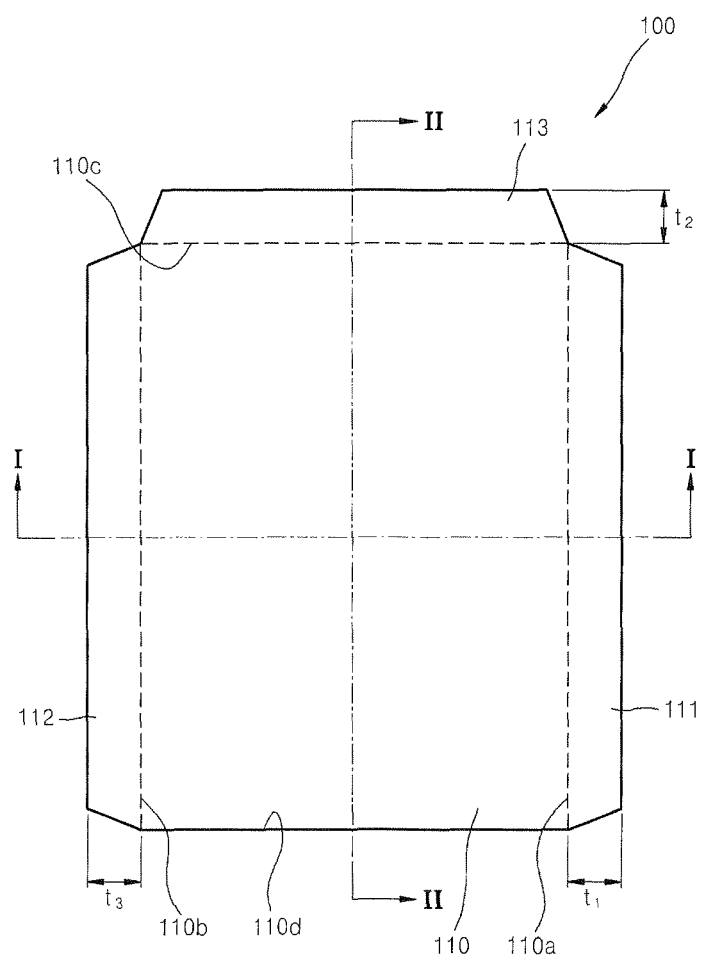
FIG. 1 is a schematic plane view of an optical adhesive film according to an embodiment of the present invention.
Figure 2:
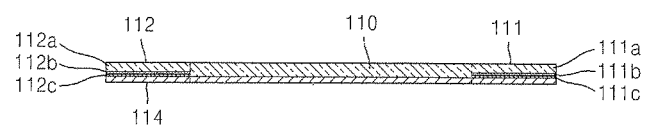
FIG. 2 is a cross-sectional view taken along the line I-I of FIG. 1.
Figure 3:
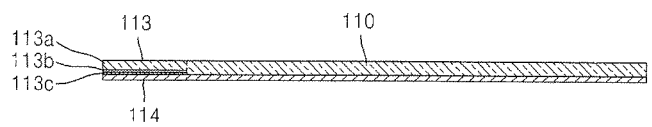
FIG. 3 is a cross-sectional view taken along the line II-II of FIG. 1.

FIG. 1 is a schematic plane view of an optical adhesive film 100 according to an embodiment of the present invention. FIG. 2 is a cross-sectional view taken along the line I-I of FIG. 1. FIG. 3 is a cross-sectional view taken along the line II-II of FIG. 1.

Referring to FIGS. 1 to 3, the optical adhesive film 100 includes a transmission unit 110, a first wing member 111, a second wing member 112, a third wing member 113, first, second, and third light-shielding members 111b, 112b, and 113b, first, second, and third reflection members 111c, 112c, and 113c, and an adhesive member 114.

Figure 4:
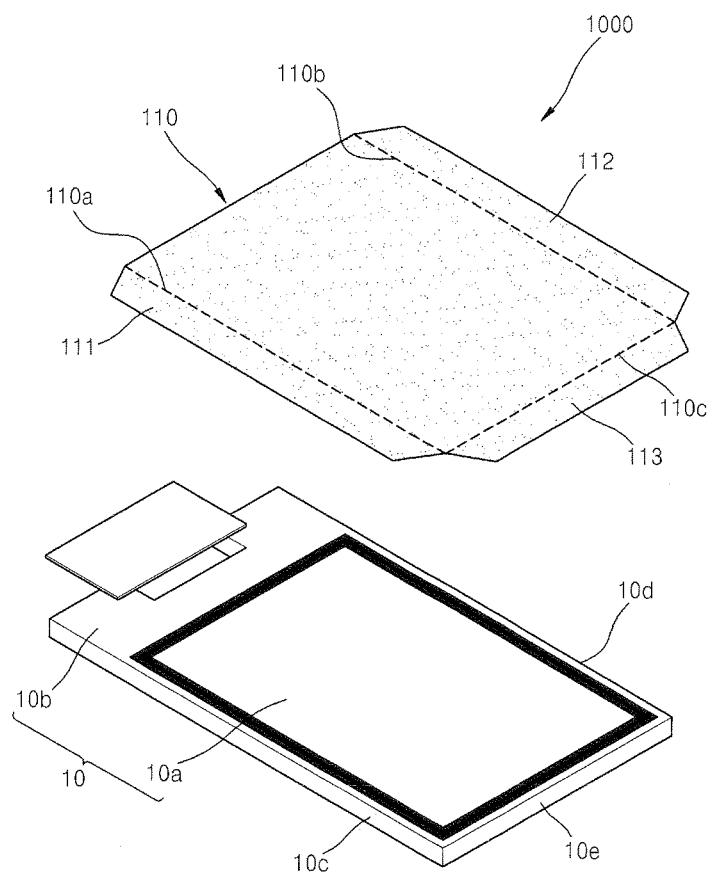
FIG. 4 is a schematic exploded perspective view of a flat panel display device that includes the optical adhesive film of FIG. 1, according to an embodiment of the present invention.
Figure 5:
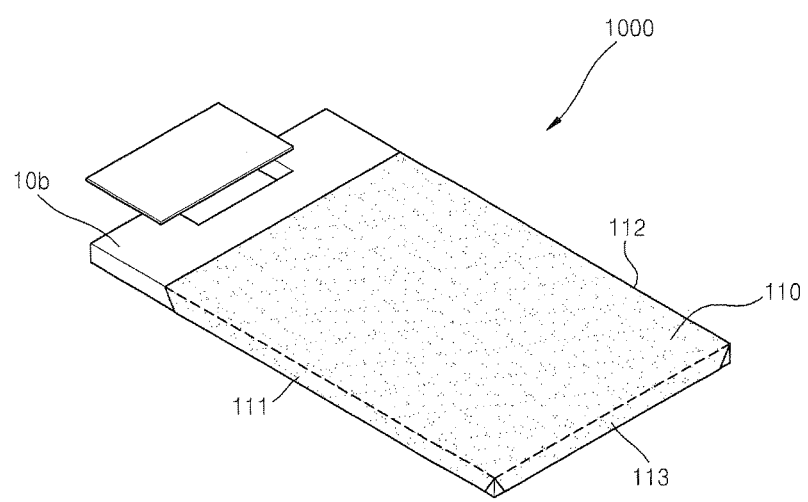
FIG. 5 is a schematic perspective view of the flat panel display device of FIG. 4.

The transmission unit 110 is disposed on a display region 10a of a flat panel display device 1000 illustrated in FIGS. 4 and 5. The transmission unit 110 may allow light emitted from the flat panel display device 1000 to transmit through. The transmission unit 110 may be formed of a material having high permeability to visible light. For example, the transmission unit 110 may be formed of a material such as polyethylene terephthalate (PET), a triacetyl cellulose (TAC) film, polyethylene (PE), acryl, or polyolefin.

The transmission unit 110 is disposed on a display region 10a of the flat panel display device 1000 and may thus have a shape corresponding to that of the display region 10a. Referring to FIGS. 4 and 5, a flat panel display module 10 has a rectangular shape, and the transmission unit 110 of the optical adhesive film 100 may thus have a rectangular shape corresponding to the shape of the display region 10a of the flat panel display module 10.

The first to third wing members 111 to 113 may extend from first to third side surfaces 110a, 110b, and 110c of the transmission unit 110, respectively.

When the first to third wing members 111 to 113 of the optical adhesive film 100 are folded, not only side portions of the flat panel display module 10 but also a portion of a rear surface of the flat panel display module 10 may be covered with the first to third wing members 111 to 113. Specifically, when the first wing member 111 of the optical adhesive film 100 is folded, a side surface 10c of the flat panel display module 10 and a portion of the rear surface of the flat panel display module 10 are covered with the first wing member 111. When the second wing 112 of the optical adhesive film 100 is folded, a side surface 10d of the flat panel display module 10 and a portion of the rear surface of the flat panel display module 10 are covered with the second wing member 112. When the third side of the transmission unit 110 is folded, a top side surface 10e of the flat panel display module 10 and a portion of the rear surface of the flat panel display module 10 are covered with the third wing member 113. Widths t1, t2, and t3 of the first to third wing members 111 to 113 may be greater than a thickness of the flat panel display module 10.

In the current embodiment, the optical adhesive film 100 covers the entire display region 10a of the flat panel display device 1000 and the side and portions of the rear surfaces of flat panel display module 10, thereby improving adhesive strength between the constitutional elements of the flat panel display module 10, as will be described in detail later.

The first wing member 111 may include a first base portion 111a, the first light-shielding member 111b, and the first reflection member 111c. The second wing member 112 may include a second base portion 112a, the second light-shielding member 112b, and the second reflection member 112c. The third wing member 113 may include a third base portion 113a, the third light-shielding member 113b, and the third reflection member 113c.

That is, the first wing member 111 may include the first base portion 111a, the first light-shielding member 111b on the first base portion 111a, and the first reflection member 111c on the first light-shielding member 111b.

The second wing member 112 may include the second base portion 112a, the second light-shielding member 112b on the second base portion 112a, and the second reflection member 112c on the second light-shielding member 112b.

The third wing member 113 may include the third base portion 113a, the third light-shielding member 113b on the third base portion 113a, and the third reflection member 113e on the third light-shielding member 113b.

The first to third base portions 111a to 113a may extend from the first to third side surfaces 110a to 110c of the transmission unit 110, respectively.

The first to third base portions 111a to 113a may be formed of the same material as the transmission unit 110. That is, the first to third base portions 111a to 113a may be formed of a material such as PET, a TAC film, PE, acryl, or polyolefin, similar to the transmission unit 110.

The first to third light-shielding members 111b to 113b may be disposed on surfaces of the first to third base portions 111a to 113a, respectively. For example, the first light-shielding member 111b may be disposed on the first base portion 111a, the second light-shielding member 112b may be disposed on the second base portion 112a, and the third light-shielding member 113 may be disposed on the third base portion 113a. The first to third light-shielding members 111b to 113b may be formed of paint or pigment that absorbs light, and may be formed by applying such paint or pigment onto surfaces of the first to third base portions 111a to 113a, respectively. The first to third light-shielding members 111b to 113b may absorb external light incident on a side surface of the flat panel display device 1000.

The first to third reflection members 111c to 113c may be formed on the first to third light-shielding members 111b to 113b, respectively. The first to third reflection members 111c to 113c may be formed of paint or pigment that reflects light, and may be formed by applying such paint or pigment onto the first to third light-shielding members 111b to 113b, respectively. The first to third reflection members 111c to 113c are disposed facing the flat panel display module 10, and reflect light emitted from the flat panel display module 10, thereby preventing the light from leaking via a side surface of the flat panel display module 10.

The adhesive member 114 may be disposed covering a surface of the transmission unit 110 and the first to third reflection members 111c to 113c. The adhesive member 114 allows the optical adhesive film 100 to be adhered onto the flat panel display module 10.

According to another embodiment of the present invention, the optical adhesive film 100 may be autohered to the flat panel display module 10 without having to use the adhesive member 114. Here, autohesion is a type of adhesion whereby two types of polymers and an inorganic surface are united with each other by not using tacks therebetween but using the force of surface energy, for example, via wetting, magnetism, or electric charges. According to another embodiment of the present invention, the optical adhesive film 100 may be autohered to the flat panel display module 10 due to surface energy therebetween. That is, the transmission unit 110 of the optical adhesive film 100 may be autohered to a front surface of the flat panel display module 10, and the first to third wing members 111 to 113 may be autohered not only to side surfaces of the flat panel display module 10 but also to a portion of the rear surface of the flat panel display module 10.

FIG. 4 is a schematic exploded perspective view of the flat panel display device 1000 that includes the optical adhesive film 100 of FIG. 1, according to an embodiment of the present invention. FIG. 5 is a schematic perspective view of the flat panel display device 1000 of FIG. 4.

Referring to FIGS. 4 and 5, the flat panel display device 1000 includes the flat panel display module 10 and the optical adhesive film 100.

The flat panel display module 10 may be a liquid crystal display device or an organic light-emitting diode display device.

The optical adhesive film 100 may be adhered onto a front surface of the flat panel display module 10. More specifically, the flat panel display module 10 may include the display region 10a for displaying an image, and a pad region 10b to connect to an external circuit (not shown). The transmission unit 110 of the optical adhesive film 100 is disposed correspondingly on the display region 10a of the flat panel display module 10. The first to third wing members 111 to 113 may be bonded with the flat panel display module 10 and cover side portions and a portion of a rear surface of the flat panel display module 10. Specifically, the first wing member 111 is bonded with the flat panel display module 10 to cover the side surface 10c and a portion of the rear surface of the flat panel display module 10. The second wing member 112 is bonded with the flat panel display module 10 to cover the side surface 10d and a portion of the rear surface of the flat panel display module 10. The third wing member 113 is bonded with the flat panel display module 10 and covers the top side surface 10e and a portion of the rear surface of the flat panel display module 10. The first to third wing members 111 to 113 may be bonded with the side and rear surfaces of the flat panel display module 10 in the form of 'C'.

However, no wing member is formed at a bottom side of the transmission unit 110 (which corresponds to a bottom side surface 110d of FIG. 1), and the transmission unit 110 is disposed to correspond to the display region 10a of the flat panel display module 10. Accordingly, the optical adhesive film 100 is not disposed on the pad region 10b of the flat panel display module 10, and the pad region 10b is exposed.

If the flat panel display module 10 is a liquid crystal display device, conventionally, a liquid crystal panel and a backlight unit are bonded with each other by adhering a double-faced tape onto a rear surface of the liquid crystal panel and a front surface of the backlight unit. However, the optical adhesive film 100 according to the current embodiment may be adhered onto all of a front surface (which corresponds to the display region 10a of FIGS. 4 and 5) and side and rear surfaces of the liquid crystal display device with the transmission unit 110 and the first to third wing members 111 to 113, thereby improving adhesive strength between the liquid crystal panel and the backlight unit.

The first, second, and third light-shielding members 111b, 112b, and 113b and the first to third reflection members 111c to 113c are stacked on surfaces of the first to third wing members 111 to 113, and the first to third reflection members 111c to 113c are disposed facing the flat panel display module 10. Thus, light emitted from a side surface of the flat panel display module 10 is reflected by the first to third reflection members 111c to 113c, thereby preventing light from leaking via the side surface of the flat panel display module 10.

Furthermore, since the first to third light-shielding members 111c to 113c are disposed between the first to third reflection members 111c to 113c and the first to third base portions 111a to 113a, the first to third light-shielding members 111c to 113c may prevent external light from being incident into the flat panel display module 10.

Since the first to third wing members 111 to 113 extend to, and are bonded with, the side and rear surfaces of the flat panel display module 10, foreign substances or moisture may be prevented from entering the flat panel display device 1000 via a side surface of the flat panel display module 10.

According to another embodiment of the present invention, the flat panel display device 1000 may be autohered to the optical adhesive film 100 and the flat panel display module 10 without having to use an additional member, e.g., an adhesive member, between the optical adhesive film 100 and the flat panel display module 10. In this case, the optical adhesive film 100 includes the transmission unit 110 and the first to third wing members 111, 112, and 113. The transmission unit 110 is autohered to the front surface of the flat panel display module 10, and the first to third wing members 111 to 113 is autohered to not only side surfaces of the flat panel display module 10 but also a portion of the rear surface of the flat panel display module 10. The first wing member 111 may include the first base portion 111a, the first light-shielding member 111b, and the first reflection member 111c. The second wing member 112 may include the second base portion 112a, the second light-shielding member 112b, and the second reflection member 112c. The third wing member 113 may include the third base portion 113a, the third light-shielding member 113b, and the third reflection member 113c. Since the first to third reflection members 111c to 113c contact the side and rear surfaces of the flat panel display module 10, the first to third reflection members 111c to 113c are autohered to the side and rear surfaces of the flat panel display module 10.

Figure 6:
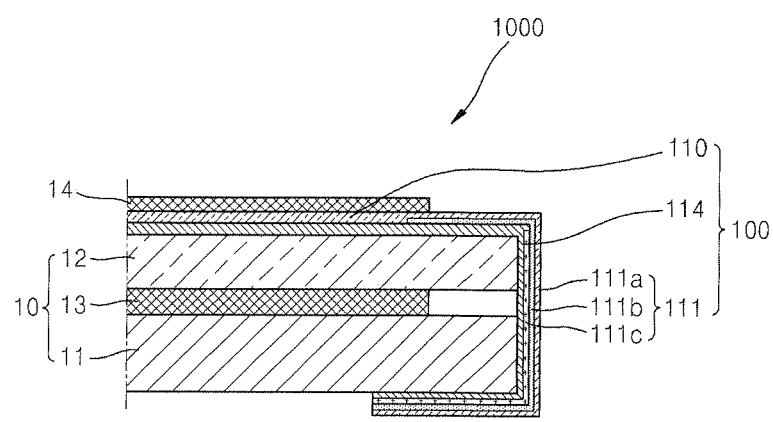
FIG. 6 is a cross-sectional view of a portion of the flat panel display device of FIG. 4.

FIG. 6 is a cross-sectional view of a portion of the flat panel display device 1000 of FIG. 4. In detail, FIG. 6 illustrates a case where the flat panel display module 10 is a liquid crystal display device (hereafter the flat panel display module 10 will be referred to as the liquid crystal display device 10). The liquid crystal display device 10 may include a backlight unit 11, a polarizing plate 13, and a liquid crystal panel 12. The polarizing plate 13 may be disposed between the backlight unit 11 and the liquid crystal panel 12. In other words, the liquid crystal display device 10 may have a structure in which the polarizing plate 13 and the liquid crystal panel 12 are sequentially stacked on the flat panel display module 10.

The transmission unit 110 of the optical adhesive film 100 may be disposed on a front surface of the liquid crystal panel 12, and is bonded with the front surface of the liquid crystal panel 12 via the adhesive member 114. The first wing member 111 may extend from a side surface of the transmission unit 110, and may be bonded with a side surface and a portion of a rear surface of the liquid crystal panel 12 via the adhesive member 114. As described above, in the current embodiment, the optical adhesive film 100 is adhered onto the liquid crystal display device 10 to cover the front, side, and rear surfaces of the liquid crystal display device 10.

The transmission unit 110 is bonded with the front surface of the liquid crystal panel 12, and is formed of a material having high permeability to visible light. Thus, an image, output via the liquid crystal panel 12, may be displayed through the transmission unit 110.

In the optical adhesive film 100 according to the current embodiment, the adhesive member 114 is disposed on front surfaces of the transmission unit 110 and the first wing member 111. The optical adhesive film 100 according to the current embodiment may be adhered onto all of a front surface (which corresponds to the display region 10a of FIGS. 4 and 5) and side and rear surfaces of the liquid crystal display device 10 with the transmission unit 110 and the first to third wing members 111 to 113, thereby improving an adhesive strength between the liquid crystal panel 12 and the backlight unit 11 of the liquid crystal display device 10.

The first wing member 111 may include the first base portion 111a, the first light-shielding member 111b, and the first reflection member 111c. The first base portion 111a extends from a side surface of the transmission unit 110. The first light-shielding member 111b and the first reflection member 111c are stacked on the first base portion 111a. Then, the adhesive member 114 is disposed on the first reflection member 111c.

The first reflection member 111c is disposed facing the liquid crystal display device 10, and reflects light emitted from the liquid crystal display device 10, thereby preventing the light from leaking to the outside. The first reflection member 111c may be disposed to correspond to the side and rear surfaces of the liquid crystal display device 10.

The first light-shielding member 111b is disposed covering an outer surface of the first reflection member 111c, and absorbs external light from the outside, thereby preventing the external light from being incident into the liquid crystal display device 10. The first light-shielding member 111b may be disposed on, not only the side and rear surfaces of the liquid crystal display device 10, but also on a portion of the front surface of the liquid crystal display device 10.

A polarizing film 14 may be disposed on the transmission unit 110.

Figure 7:
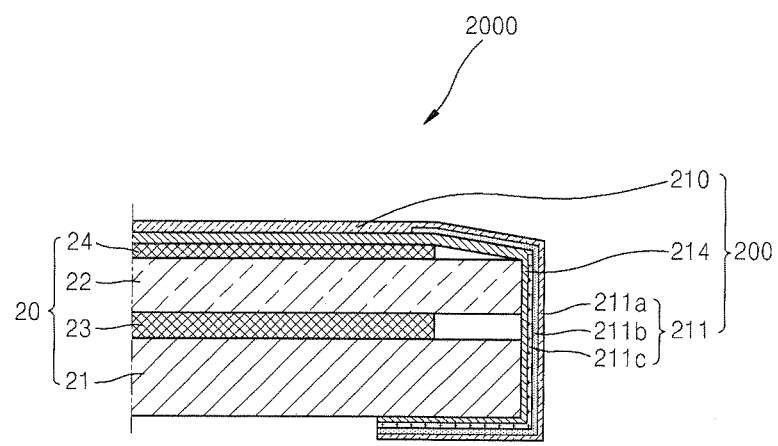
FIG. 7 is a cross-sectional view of a flat panel display device according to another embodiment of the present invention.

FIG. 7 is a cross-sectional view of a flat panel display device 2000 according to another embodiment of the present invention. Referring to FIG. 7, the flat panel display device 2000 may include a liquid crystal display device 20 and an optical adhesive film 200.

The liquid crystal display device 20 may have a structure, in which a backlight unit 21, a polarizing plate 23, a liquid crystal panel 22, and a polarizing film 24 are sequentially stacked. The optical adhesive film 200 may include a transmission unit 210, a first wing member 211, and an adhesive member 214.

The transmission unit 210 of the optical adhesive film 200 may be bonded with the polarizing film 24 on the liquid crystal panel 22 via the adhesive member 214. The first wing member 211 may extend from a side surface of the transmission unit 210, and may be bonded with a side surface and a portion of a rear surface of the liquid crystal display device 20 via the adhesive member 214. As described above, the optical adhesive film 200 may be adhered onto the liquid crystal display device 10 to cover all of a front surface and the side and rear surfaces of the liquid crystal display device 20, thereby improving adhesive strength between the constitutional elements of the liquid crystal display device 20.

The transmission unit 210 is adhered onto the entire liquid crystal panel 22, and is formed of a material having high permeability to visible light, as described above. Thus, an image, output via the liquid crystal panel 22, may be displayed by using the transmission unit 210.

In the optical adhesive film 200, the adhesive member 214 is disposed over the transmission unit 210 and the first wing member 211.

The first wing member 211 may include a base portion 211a, a light-shielding member 211b, and a reflection member 211c. The base portion 211a extends from a side surface of the transmission unit 210. The light-shielding member 211b and the reflection member 211c are stacked on the base portion 211a.

The reflection member 211c is disposed facing the liquid crystal display device 20, and reflects light emitted from the liquid crystal display device 20, thereby preventing the light from leaking to the outside. The reflection member 211c may be disposed to correspond to the side and rear surfaces of the liquid crystal display device 20.

The light-shielding member 211b is disposed covering an outer surface of the reflection member 211c, and absorbs external light from the outside, thereby preventing the external light from being incident into the liquid crystal display device 20. The light-shielding member 211b may be wider than the reflection member 211c. The reflection member 211c is disposed on the base portion 211a to cover the side and rear surfaces of the liquid crystal display device 20, but the light-shielding member 21 lb may be disposed on not only the side and rear surfaces of the liquid crystal display device 10 but also on the front surface of the liquid crystal display device 20.

Figure 8:
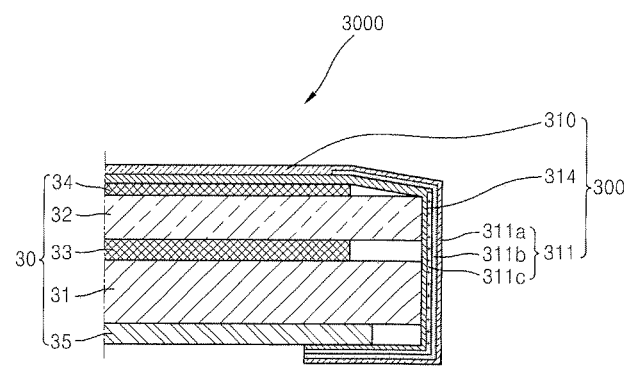
FIG. 8 is a cross-sectional view of a flat panel display device according to another embodiment of the present invention.

FIG. 8 is a cross-sectional view of a flat panel display device 3000 according to another embodiment of the present invention. Referring to FIG. 8, the flat panel display device 3000 may include a liquid crystal display device 30 and an optical adhesive film 300.

The liquid crystal display device 30 may have a structure, in which a chassis 35, a backlight unit 31, a polarizing plate 33, a liquid crystal panel 32, and a polarizing film 34 are sequentially stacked. The optical adhesive film 300 may include a transmission unit 310, a wing member 311, and an adhesive member 314.

The transmission unit 310 of the optical adhesive film 300 is bonded with the polarizing film 34 on the liquid crystal panel 32 via the adhesive member 314. The wing member 311 may extend from a side surface of the transmission unit 310, and may be bonded with a side surface and a portion of a rear surface of the liquid crystal display device 30 via the adhesive member 314. That is, the wing member 311 may extend to a rear surface of the chassis 35 and may be bonded with the rear surface of the chassis 35 via the, adhesive member 314.

As described above, the optical adhesive film 300 is adhered onto the liquid crystal display device 30 to cover the front, side, and rear surfaces of the liquid crystal display device 30, thereby improving adhesive strength between the constitutional elements of the liquid crystal display device 30.

The transmission unit 310 is bonded with the entire liquid crystal panel 32, and is formed of a material having high permeability to visible light. Thus, an image output via the liquid crystal panel 32 may be displayed using the transmission unit 310.

In the optical adhesive film 300, the adhesive member 314 is disposed over the transmission unit 310 and the wing member 311.

The wing member 311 may include a base portion 311a, a light-shielding member 311b, and a reflection member 311c. The base portion 311a extends from a side surface of the transmission unit 310. The light-shielding member 311b and the reflection member 311c are stacked on the base portion 311a.

The reflection member 311c is disposed facing the liquid crystal display device 30, and reflects light emitted from the liquid crystal display device 30, thereby preventing the light from leaking to the outside. The reflection member 311c may be disposed to correspond to the side and rear surfaces of the liquid crystal display device 30.

The light-shielding member 311b is disposed covering an outer surface of the reflection member 311c, and absorbs external light from the outside, thereby preventing the external light from being incident into the liquid crystal display device 30. The light-shielding member 311b may be wider than the reflection member 311c. The reflection member 311c is disposed on the base portion 311a to cover the side and rear surfaces of the liquid crystal display device 30, but the light-shielding member 311b may be disposed on all the side, rear, and front surfaces of the liquid crystal display device 30.

Figure 9:
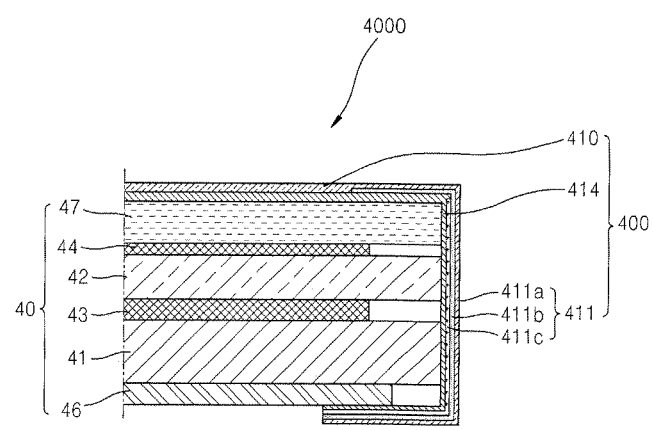
FIG. 9 is a cross-sectional view of a flat panel display device according to another embodiment of the present invention.

FIG. 9 is a cross-sectional view of a flat panel display device 4000 according to another embodiment of the present invention. Referring to FIG. 9, the flat panel display device 4000 may include a liquid crystal display device 40 and an optical adhesive film 400.

The liquid crystal display device 40 may have a structure, in which a chassis 45, a backlight unit 41, a polarizing plate 43, a liquid crystal panel 42, a polarizing film 44, and a touch panel 47 are sequentially stacked. The optical adhesive film 400 may include a transmission unit 410, a wing member 411, and an adhesive member 414.

The transmission unit 410 of the optical adhesive film 400 may be bonded with the touch panel 47 on the liquid crystal panel 32 via the adhesive member 414. The wing member 411 may extend from a side surface of the transmission unit 410, and may be bonded with the side surface and a portion of a rear surface of the liquid crystal display device 40 via the adhesive member 414. That is, the wing member 411 may extend to a rear surface of the chassis 45 and may be bonded with the rear surface of the chassis 45 via the adhesive member 414.

As described above, the optical adhesive film 400 is adhered onto the liquid crystal display device 40 to cover all the front, side, and rear surfaces of the liquid crystal display device 40, thereby improving adhesive strength between the constitutional elements of the liquid crystal display device 40.

The transmission unit 410 is bonded with the entire liquid crystal panel 42, and is formed of a material having high permeability to visible light. Thus, an image output via the liquid crystal panel 42 may be displayed using the transmission unit 410.

In the optical adhesive film 400, the adhesive member 414 is disposed over the transmission unit 410 and the wing member 411.

The wing member 411 may include a base portion 411a, a light-shielding member 411b, and a reflection member 411c. The base portion 411a extends from a side surface of the transmission unit 410. The light-shielding member 411b and the reflection member 411c are stacked on the base portion 411a.

The reflection member 411c is disposed facing the liquid crystal display device 40, and absorbs light emitted from the liquid crystal display device 40, thereby preventing the light from leaking to the outside. The reflection member 411c may be disposed to correspond to the side and rear surfaces of the liquid crystal display device 40.

The light-shielding member 411b may be disposed covering an outer surface of the reflection member 411c, and may absorb external light from the outside, thereby preventing the external light from being incident into the liquid crystal display device 40. The light-shielding member 411b may be wider than the reflection member 411c. The reflection member 411c is disposed on the base portion 411a to cover the side and rear surfaces of the liquid crystal display device 40, but the light-shielding member 411b may be disposed on all the side, rear, and front surfaces of the liquid crystal display device 40.

According to an embodiment of the present invention, an optical adhesive film is adhered onto not only a front surface of a flat panel display module but also side and rear surfaces of the flat panel display module, thereby improving adhesive strength between the constitutional elements of the flat panel display module.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. A flat panel display device comprising:
a flat panel display module having a display surface for displaying an image; and
an optical adhesive film disposed on the display surface, side surfaces of the flat panel display module and a portion of a rear surface of the flat panel display module, wherein the image displayed on the display surface of the flat panel display module is output through the optical adhesive film, the optical adhesive film comprising:
a transmission unit that is disposed on the display surface of the flat panel display module, the transmission unit allowing the transmission of an image, the transmission unit covering the display surface entirely; and
a wing member extending from at least one side of the transmission unit without separation from the transmission unit, and substantially covers at least a side surface and a portion of the rear surface of the flat panel display module, the wing member including a base portion seamlessly extending from the transmission unit, a reflection member disposed on the base portion, and a light-shielding member disposed between the reflection member and the base portion, the light-shielding member absorbing external light incident via the base portion, the reflection member reflecting light emitted from the flat panel display module to prevent the light from leaking to outside.

2. The flat panel display device of claim 1, wherein the optical adhesive film comprises:
an adhesive disposed over the transmission unit and the wing member, wherein the adhesive is disposed between the transmission unit and the flat panel display module and between the wing member and the flat panel display module so as to bond the flat panel display module, the transmission unit, and the wing member with one another.

3. The flat panel display device of claim 1, wherein the transmission unit allows light emitted from the flat panel display module to be transmitted through the transmission unit.

4. The flat panel display device of claim 3, wherein the transmission unit comprises polyethylene terephthalate (PET), a triacetyl cellulose (TAC) film, polyethylene (PE), acryl, or polyolefin.

5. The flat panel display device of claim 1, wherein a size of the transmission unit is approximately equal to or greater than a size of the display surface of the flat panel display module.

6. The flat panel display device of claim 1, wherein a width of the wing member is greater than a height of the flat panel display module.

7. The flat panel display device of claim 1, wherein the base portion is combined with the transmission unit as one body.

8. The flat panel display device of claim 7, wherein the base portion comprises polyethylene terephthalate (PET), a triacetyl cellulose (TAC) film, polyethylene (PE), acryl, or polyolefin.

9. The flat panel display device of claim 1, wherein the light-shielding member comprises a material which absorbs light.

10. The flat panel display device of claim 9, wherein the light-shielding member comprises a paint or a pigment that absorbs visible light.

11. The flat panel display device of claim 1, wherein a size of the light-shielding member is approximately equal to or greater than a size of the reflection member.

12. The flat panel display device of claim 1, wherein the light-shielding member is disposed substantially on the entire wing member and a portion of the transmission unit.

13. The flat panel display device of claim 1, wherein the flat panel display module comprises a backlight unit, a polarizing plate, and a liquid crystal panel that are sequentially stacked.

14. A flat panel display device comprising:
a flat panel display module having a display surface for displaying an image; and
an optical adhesive film disposed on the display surface, side surfaces of the flat panel display module and a portion of a rear surface of the flat panel display module, the optical adhesive film comprises:
a transmission unit disposed on the display surface of the flat panel display module, the transmission unit allowing the transmission of an image, the transmission unit covering the display surface entirely; and
a wing member extending from at least one side surface of the transmission unit without separation from the transmission unit, and substantially covering at least a side surface and a portion of a rear surface of the flat panel display module, the wing member including a base portion seamlessly extending from the transmission unit, a reflection member disposed on the base portion, and a light-shielding member disposed between the reflection member and the base portion, the light-shielding member absorbing external light incident via the base portion, the reflection member reflecting light emitted from the flat panel display module to prevent the light from leaking to outside, wherein the transmission unit is disposed on the display surface of the flat panel display module, and the wing member is disposed on a side surface and a portion of the rear surface of the flat panel display module, both of the transmission unit and the wing member directly attached to the flat panel display module without an intervening adhesive therebetween.

\* \* \* \* \*